US008601422B2

(12) United States Patent
Tripathi et al.

(10) Patent No.: US 8,601,422 B2
(45) Date of Patent: Dec. 3, 2013

(54) METHOD AND SYSTEM FOR SCHEMATIC-VISUALIZATION DRIVEN TOPOLOGICALLY-EQUIVALENT LAYOUT DESIGN IN RFSIP

(75) Inventors: Alok Tripathi, Noida (IN); Abha Jain, Greater Noida (IN); Parag Choudhary, Noida (IN); Utpal Bhattacharya, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 647 days.

(21) Appl. No.: 12/341,152

(22) Filed: Dec. 22, 2008

(65) Prior Publication Data
US 2010/0115487 A1    May 6, 2010

Related U.S. Application Data

(60) Provisional application No. 61/110,754, filed on Nov. 3, 2008.

(51) Int. Cl.
*G06F 17/50* (2006.01)
(52) U.S. Cl.
USPC ........... 716/122; 716/100; 716/102; 716/103; 716/104; 716/118; 716/119; 716/126; 716/129; 716/130; 716/136

(58) Field of Classification Search
USPC ................ 716/100–104, 118–119, 122, 126, 716/129–130, 136, 138
See application file for complete search history.

(56) References Cited

U.S. PATENT DOCUMENTS

| | | | |
|---|---|---|---|
| 6,904,571 B1 * | 6/2005 | Schmidt et al. | 716/112 |
| 7,418,683 B1 * | 8/2008 | Sonnard et al. | 716/122 |
| 7,490,309 B1 * | 2/2009 | Kukal et al. | 716/132 |
| 7,603,642 B2 * | 10/2009 | Subasic et al. | 716/119 |
| 2003/0172358 A1 * | 9/2003 | Alon et al. | 716/1 |
| 2010/0037136 A1 | 2/2010 | Choudhary et al. | |

OTHER PUBLICATIONS

Gupta, S., "Tutorial T7B: RF Analysis and Simulation with Focus on RF SiP Methodology," 20th International Conference on VLSI Design, 2007. Held jointly with 6th International Conference on Embedded Systems., Jan. 2007.

* cited by examiner

*Primary Examiner* — Nghia Doan
(74) *Attorney, Agent, or Firm* — Vista IP Law Group, LLP

(57) ABSTRACT

An improved approach for automatically generating physical layout constraints and topology that are visually in-sync with the logic schematic created for simulation is described. The present approach is also directed to an automatic method for transferring topology from logic design to layout.

22 Claims, 10 Drawing Sheets

//==================================================================

METHOD AND SYSTEM FOR SCHEMATIC-VISUALIZATION DRIVEN TOPOLOGICALLY-EQUIVALENT LAYOUT DESIGN IN RFSIP

CROSS-REFERENCE TO RELATED APPLICATIONS

The present application claims the benefit of U.S. Provisional Application Ser. No. 61/110,754, filed on Nov. 3, 2008, which is hereby incorporated by reference in its entirety.

BACKGROUND

The invention relates to the design and manufacture of integrated circuits. An integrated circuit (IC) has a large number of electronic components, such as transistors, logic gates, diodes, and wires, which are fabricated by forming layers of different materials and of different geometric shapes on various regions of a silicon wafer. Many phases of physical design may be performed with computer aided design (CAD) tools or electronic design automation (EDA) systems. To design an integrated circuit, a designer first creates high level behavior descriptions of the IC device using a high-level hardware design language. An EDA system typically receives the high level behavior descriptions of the IC device and translates this high-level design language into netlists of various levels of abstraction using a computer synthesis process. A netlist describes interconnections of nodes and components on the chip and includes information on circuit primitives such as transistors and diodes, their sizes and interconnections, for example.

An integrated circuit designer may use a set of layout EDA application programs to create a physical integrated circuit design layout from a logical circuit design. The layout EDA application uses geometric shapes of different materials to create the various electrical components on an integrated circuit and to represent electronic and circuit IC components as geometric objects with varying shapes and sizes. After an integrated circuit designer has created an initial integrated circuit layout, the integrated circuit designer then verifies and optimizes the integrated circuit layout using a set of EDA testing and analysis tools. Verification may include, for example, design rule checking to verify compliance with rules established for various IC parameters.

Prior to creating a physical layout for an RF circuit, the "front end" of the design process includes creating a schematic of the electrical design for simulation purposes. RF designers use transmission line components in the schematic to design topologies of the net. An RF net can be connected to multiple pins. RF designers specify how exactly the pin-to-pin connections go over the net by inserting transmission line components and specifying certain constraints of the transmission line components, such as the maximum/minimum pin-to-pin distance, pin-width, conductor spacing, topology, and the like.

If the simulation results are satisfactory, the topology is entered into a layout tool for creation of the physical layout of the RF circuit. Currently, there is no easy tool-assisted automated process to transfer routing intent directly from schematic to layout or to back-annotate layout changes upstream to the schematic. If a change in the design is necessary during layout (for example, if a width, length, or other such parameter needs to be adjusted), that change needs to be fed back into the schematic so that the design can be simulated again to be sure that the design will operate correctly if that change is incorporated into the design. In addition, parasitics generated during layout need to be fed back and simulated in the front end of the design process.

This process is iterated until the required topology behavior is achieved. Multiple iterations between schematic design, simulation and layout design are common practice to meet the design specification.

RF designs require a strong coupling between the logic and layout designer, since track routing of the layout has a strong impact on the design behavior. RFSiP designers specify the routing lengths and routing topology upfront in the schematic. Since there is no easy automated process for transferring this routing intent directly from schematic to layout, the designer manually shares the inputs regarding routing constraints and topology with the layout designer. Alternatively, the RF designer has to enter complicated properties on the schematic or a separate tool is used to capture topology which may not visually match with the schematic and is not intuitive to the layout designer. This situation is especially problematic for RF designs where the schematic captures an impedance matching circuit, so schematic sequence is very important.

In one approach for transferring topology from schematic to layout, transmission line topology is defined in the logic design using special transmission line components. These components map to shapes in the layout. Thus, the topology is transferred to the layout as a series of physical shapes having one-to-one mapping with the schematic. One problem with this approach is that the layout engineer loses routing flexibility since routing is exactly specified using components on the schematic itself. Another problem with this approach is that the logic schematic becomes complicated since the RF designer needs to add one schematic component per track shape. For example, the layout 100 shown in FIG. 1 would require three Microstrip and two bend component instances in the schematic.

In another approach for transferring topology from schematic to layout, no topology information is passed automatically from the simulation logic schematic to the layout. Rather, the topology is manually defined using separate signal exploration tools. For example, FIG. 2 depicts a signal exploration topology 200 for a single logical net in the schematic. Clearly, one problem with this approach is that there is no way to map the topology 200 shown in FIG. 2 back to the schematic. Another problem with this approach is that the schematic is non-intuitive to the layout designer, since it does not have any topology information. Still another problem with this approach is that topology violations cannot be detected in the schematic. This approach typically uses transmission line kind of components but in a separate UI.

SUMMARY

Embodiments of the present invention enable RFSiP designers to automatically generate physical layout constraints and topology which can be visually in-sync with the logic schematic created for simulation. To accomplish this, routing components inserted in the schematic for simulation can be transferred as constraints to layout. In addition, routing topology as drawn in the schematic can be automatically generated in layout. Further, simulation parameters specified between pin-groups can be automatically transferred as sets of constraints, and global net constraints can be generated automatically.

Embodiments of the present invention provide an approach for capturing information relating to topology and constraints in a schematic so that the layout can be done as specified in the front end by the schematic user. The solution should be intuitive so that the RF designer can see the circuit in an RF design way. Currently, RF designers do not have the benefit of a schematic that captures an RF design with a topology definition that specifies how the back end layout is achieved. With the present invention, the overall strategy designed in the front end is intuitive for the RF designer because it looks exactly the way the RF circuit will look. Embodiments of the present invention can also provide the layout designer with flexibility in routing the details.

In addition, embodiments of the present invention provide an automatic method for transferring topology from logic design to layout. Since the simulation parameters are directly used in the physical layout, the process reduces iterations required between the logical and the physical designer in the design process. Exemplary embodiments of the present invention can provide an automated Engineering Change Order mechanism for further iterations, hence reducing overall design cycle. In addition, some embodiments of the present invention can provide an automated method to the logic and lead designers for verifying that the final layout is meeting the intent of the simulated logical design.

Further details of aspects, objects, and advantages of the invention are described below in the detailed description, drawings, and claims. Both the foregoing general description and the following detailed description are exemplary and explanatory, and are not intended to be limiting as to the scope of the invention.

BRIEF DESCRIPTION OF THE FIGURES

The accompanying drawings are included to provide a further understanding of various embodiments of the invention and, together with the Detailed Description, serve to explain the principles of various embodiments of the invention.

DETAILED DESCRIPTION

Embodiments of the present invention are directed to approaches for creating layouts of electrical designs. According to some of the embodiments, physical constraint information used during the simulation phase of the design is automatically fed downstream such that the constraint information may be used for generating a layout. The constraint information may include both topology and physical constraint information, which are based upon simulation.

While the illustrative examples shown below are directed to RF circuit designs and SiP circuit designs, it will be clear to one of ordinary skill that the invention can be applied to a much broader range of electrical designs and is not to be limited to the specific examples shown below. For example, the present invention is also applicable to non-RF nets and net bundles. Thus, the present invention is not restricted to RF design or SiP designs, unless so claimed.

Embodiments of the present invention provide an intuitive way to enter the routing topology for an RF net as the schematic is being created for the first time. Layout routing topology can automatically be generated from the transmission line component instances depending on their connectivity in the logical design. Automatic transfer of topology can be done for RF passive components used in the schematic, e.g., Microstrip, Stripline, and the like. Topology transfer can also be supported for coupled groups of nets by using coupled net components in the schematic.

Figure 1:
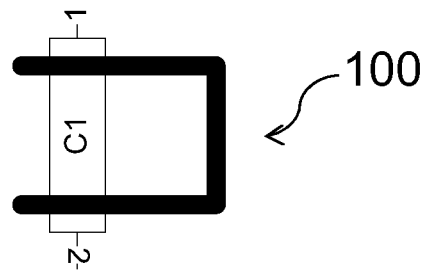
FIG. 1 is an illustrative example of a layout used in RF design.
Figure 2:
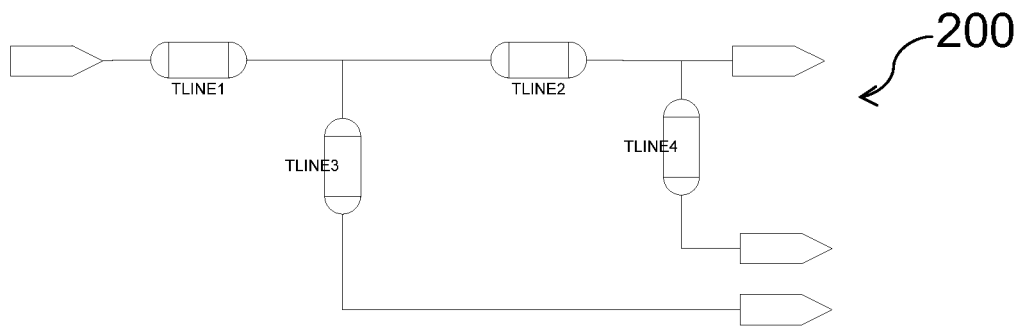
FIG. 2 is an illustrative example of a signal exploration topology.
Figure 3:
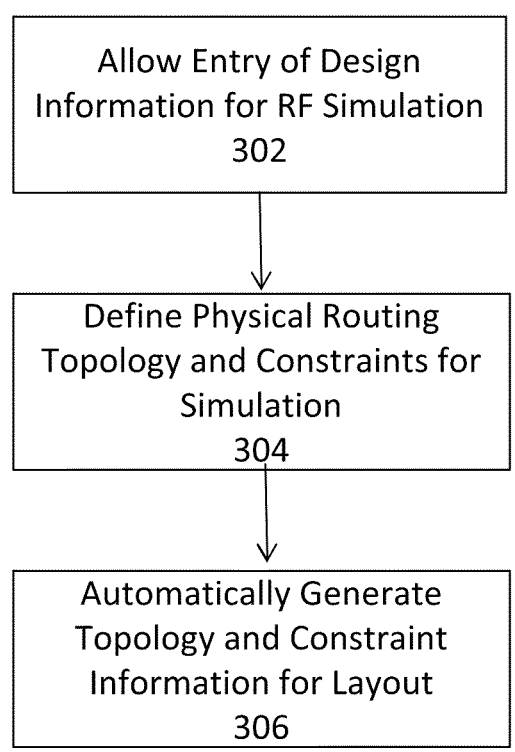
FIG. 3 shows a high level flow of a process for generating topology and transferring the topology from logic design to layout, according to some embodiments of the invention.

FIG. 3 is a high-level flow chart of embodiments of processes for implementing the invention. It is noted that these processes are not described in any particular order. It should be well understood by one of ordinary skill in the art that the processes depicted in FIG. 3 may be performed in any order and that some of the actions are optional in nature and need not be performed in implementing the invention.

The process begins at 302 by allowing the user to generate/perform design entry for an RF design that can be used for simulation. Any suitable approach can be used for this design entry. For example, the Virtuoso® Schematic Editor (also known as "Composer") tool, available from Cadence Design Systems Inc. of San Jose, Calif., can be used for design entry. Exemplary embodiments of the present invention provide a user with an intuitive way of using a single integrated design entry for RF simulation. In addition, some embodiments of the present invention can allow topology specification on RF nets going across multiple pages and/or across design hierarchy in the schematic.

In 304, the user can define physical constraints for the design that will be used for the simulation. Any suitable type of constraint that can be used for simulation can be defined by the user. For example, physical routing topology and physical net constraints are types of parameters and constraints that can be defined by the user at 304.

Figure 4:
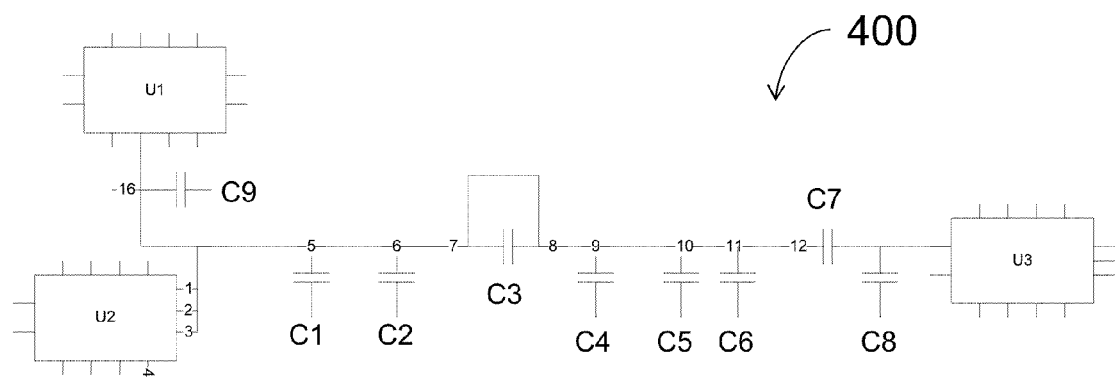
FIG. 4 is an illustrative example of a schematic including an RF net.

In one embodiment, the present invention provides an approach for ensuring that the layout routing follows the topology of the schematic. For example, FIG. 4 shows a schematic 400 with an RF net connecting multiple physical pins, e.g., pin 1 through pin 12, and pin 16. For the example shown in FIG. 4, the present invention can provide an approach for ensuring that the capacitors, e.g., C1 through C9, are routed in exactly the same order as specified in the schematic 400.

Figure 5:
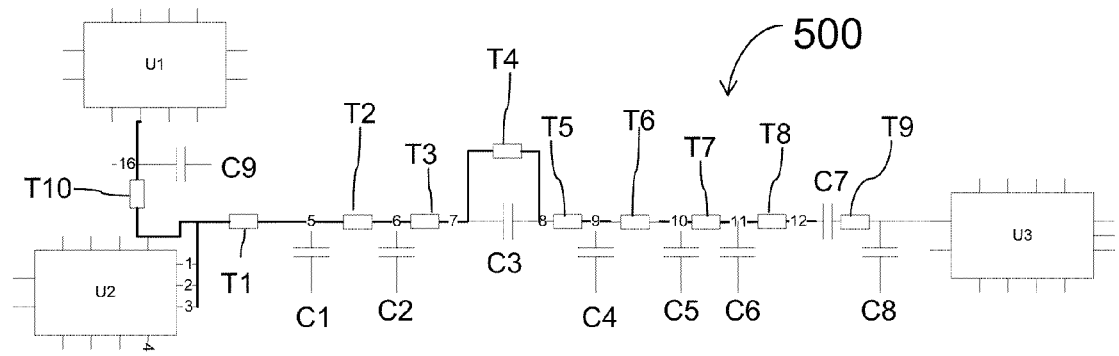
FIG. 5 is an illustrative example of the schematic of FIG. 4 with transmission line components inserted between pin pairs, according to some embodiments of the invention.
Figure 5A:
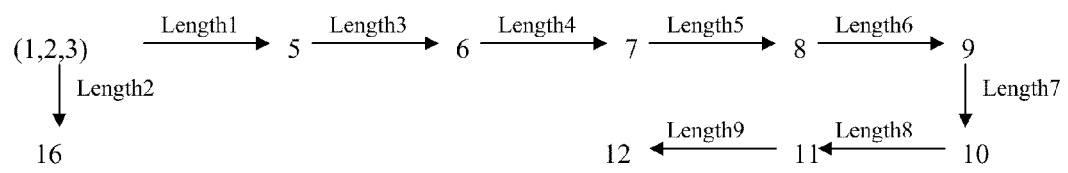
FIG. 5A is an illustrative example of constraints between pins that can be transferred to layout, according to some embodiments of the invention.

Embodiments of the present invention allow the designer to insert transmission line components, e.g., T1 through T10, between pin pairs, e.g., pin 1 through pin 12, and pin 16, as shown in the schematic 500 in FIG. 5, in order to simulate the design. The transmission line components T1 through T10 can have width and length parameters specified by the designer, and can be understood by the RF simulator. The schematic designer expects the layout routing to be performed in the same manner so that it meets design constraints. For the RF net 500 shown in FIG. 5, the layout needs to understand the constraints between the sets of points as illustrated in FIG. 5A. Thus, FIG. 5A illustrates the pin pairs between which constraints need to be defined. At 306, the processor can automatically generate topology and constraint information for the layout based on the parameters used for simulation. The layout topology and constraint information can then be used for generating a physical layout of the RF design. Additionally or alternatively, the layout topology and constraint information can be displayed on a display device or stored in a configured data structure on a computer readable medium. Further, the layout topology information and layout constraint information can be automatically transferred to a layout tool for generating the physical layout, such that the physical layout is visually in-sync with the schematic.

Figure 9:
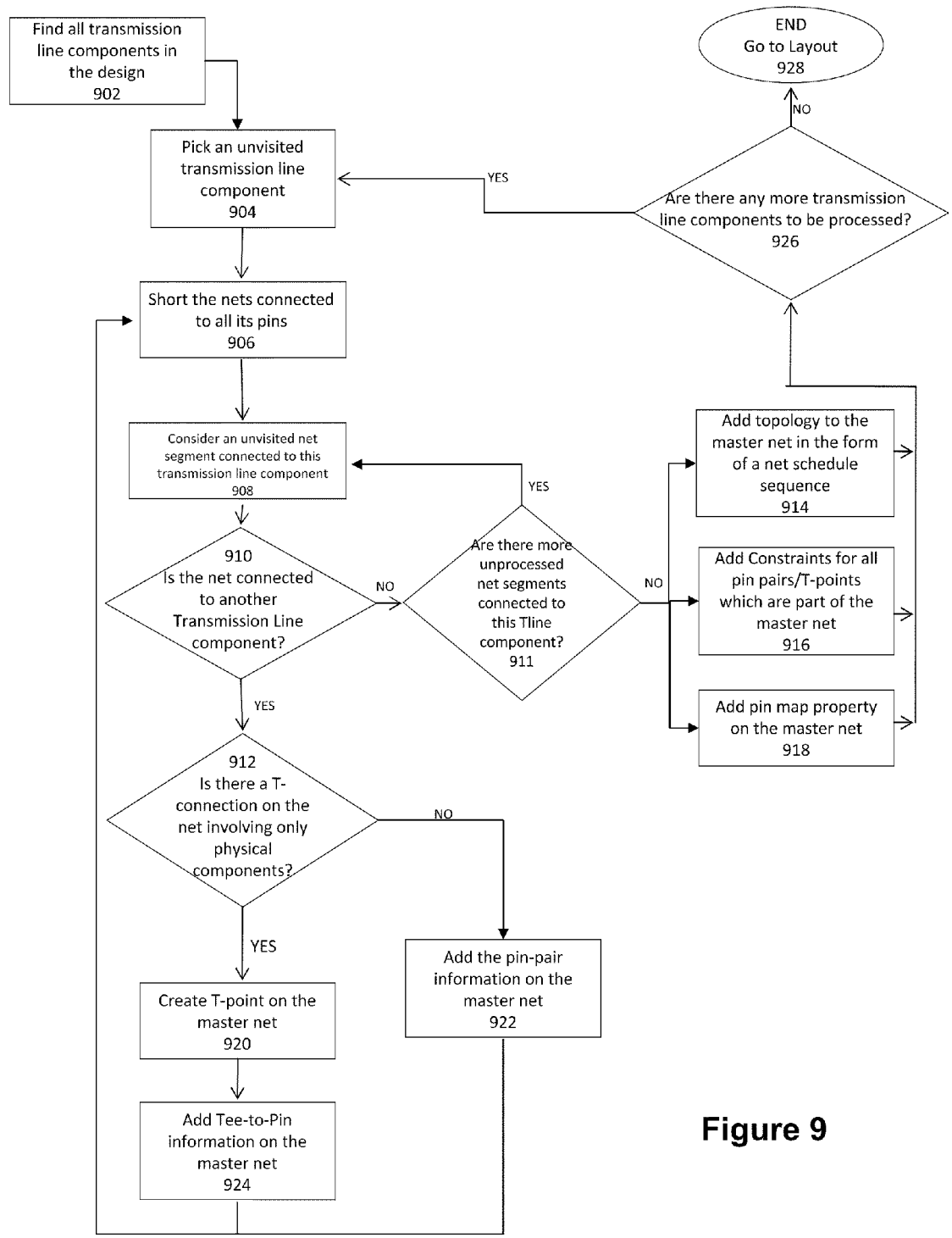
FIG. 9 shows a more detailed flowchart of a process for automatically generating topology and constraint information for layout, according to some embodiments of the invention.

Referring to FIG. 9, some of the processing actions that can be taken in implementing step 306 will be described. Again, it is noted that these actions are not described in any particular order. It should be well understood by one of ordinary skill in the art that the actions depicted in FIG. 9 may be performed in any order and that some of the actions are optional in nature and need not be performed in implementing the invention.

At 902, all transmission line components in the design are located. One approach for accomplishing 902 may be to traverse the schematic and identify each transmission line component in the schematic. A list of each identified transmission line component can be generated and maintained. The list of identified transmission line components is not necessarily in any order. However, in some embodiments, it may be beneficial to order the list of identified transmission line components according to the order that the transmission line components are connected together in a common net.

In 904, one of the transmission line components that has not already been processed is chosen. The transmission line components are not transferred to layout because the transmission line components are simulation-only components. Thus, in 906, the nets connected to the chosen transmission line component's pins are shorted. At 908, one of the net segments that is connected to the chosen transmission line component, and has not already been processed, is selected for consideration.

At 910, a determination is made as to whether the net is connected to another transmission line component. If it is determined that the net is connected to another transmission line component, the end of the net has not yet been reached, and the process flow continues to 912. At 912, a determination is made as to whether there is a T-connection on the net involving only physical components, i.e., not transmission line components. If there is only one transmission line component, then there is not a T-connection on the net and the pin-pair information is added to the master net at 922. After 922, the process flow returns to 906.

The master net name can be generated automatically and uniquely and can be determined by a customizable algorithm. Any scheme which generates a unique name can be used. For example, a scheme based on property values or concatenation of logical net names can be used.

If the net is connected to two or more components, then there is a T-connection on the net and a T-point is created on the master net (920), if the T-point has not already been defined. If necessary, multiple T-points can be created. The tee-to-pin information, i.e., the tee-to-pin constraint based on the transmission line component length, width, etc., is then added on the master net at 924, and the process flow returns to 906.

If, at 910, it is determined that the net is not connected to another transmission line component, then a determination is made as to whether there are more unprocessed net segments connected to the transmission line component (911). If there are more unprocessed net segments connected to the transmission line component, the process flow returns to 908. If, at 911, it is determined that there are not more unprocessed net segments connected to the transmission line component, then the end of the net has been reached and the data can be processed in preparation for physical layout generation. Processing the data for layout generation can include adding topology to the master net in the form of a net schedule sequence (914), which tells the layout tool the order in which the connections are to be made. Processing the data can also include adding constraints for all pin pairs (including T's) that are part of the master net (916). Constraints for the pin pairs can include pin width, pin-to-pin propagation delay, and the like. Processing the data can further include adding a pin map property on the master net (918). Such pin map property can be used for back-annotation of sub-schematic blocks.

At 926, a determination is made as to whether there are any more transmission line components to be processed. If it is determined that there are remaining transmission line components that have not yet been processed, the process flow returns to 904. If it is determined that all of the transmission line components have been processed, the process ends at 928 and the resulting data can automatically be transferred to the layout tool.

Figure 6:
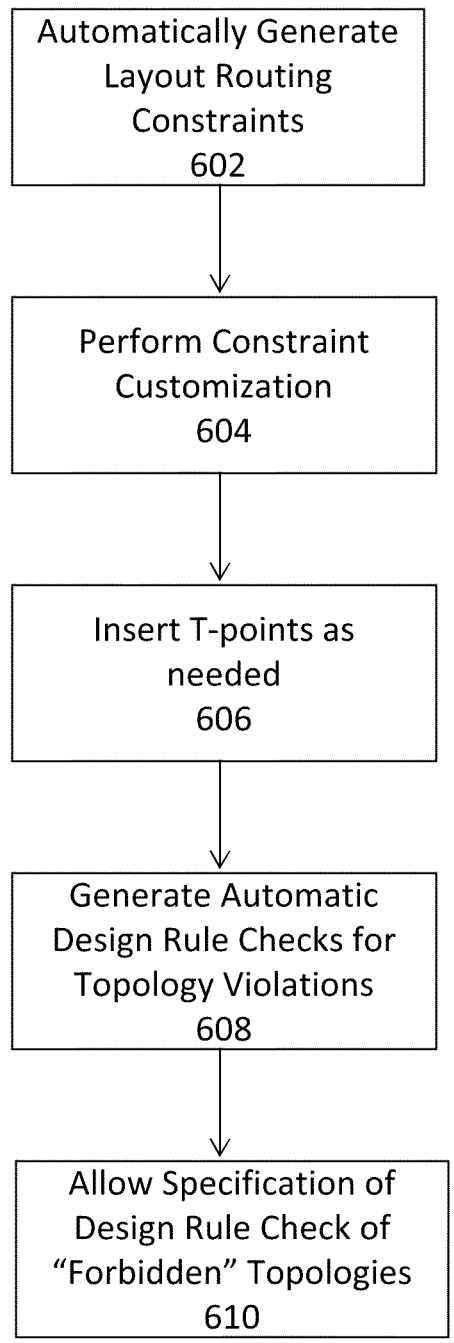
FIG. 6 shows a more detailed flowchart of a process for generating topology and constraint information for layout, according to some embodiments of the invention.

FIG. 6 illustrates one approach for implementing the features of generating topology and constraint information for layout. Again, it is noted that these actions are not described in any particular order. It should be well understood by one of ordinary skill in the art that the actions depicted in FIG. 6 may be performed in any order and that some of the actions are optional in nature and need not be performed in implementing the invention.

At 602, layout routing constraints can automatically be generated. For example, constraints on propagation delay (minimum and maximum), maximum etch width, and conductor spacing (for coupled nets) can be generated. These constraints are auto-translated from the simulation parameters like width and length specified by the user on the transmission line components. Thus, the routed layout is auto-synced up with the observed simulation results for the logic schematic.

At 604, constraint customization can be performed using setup files. For example, for a transmission line component, the user can specify a fixed length and width for front-end simulation. For the purpose of routing, the user can instruct the tool to generate corresponding minimum and maximum length and width constraints for routes. The minimum and maximum calculations can be done using a default multiplier on the specified value. The default multiplier can be overridden by the user.

Thus, according to some embodiments, the present invention provides for specifying a range of lengths as a routing constraint. Since routing cannot be guaranteed to be feasible with exact lengths, a user can specify a length with a pre-defined tolerance as a routing constraint. This tolerance could be a pre-defined global value or component-specific defined by the user. For example, a length constraint of 50 µm may be translated to a routing length of between 45 µm and 55 µm, based on a tolerance of 10%. Thus, constraint generation can still be automatic while maintaining some flexibility in the back end, or layout, of the design process.

Similarly, embodiments of the present invention can allow for a limit on the total length of the RF net. This limit can automatically be generated as a net routing constraint for the user. For example, an RF net may map to three segments with simulation lengths 50 µm, 100 µm and 100 µm respectively. For routing, the net constraint has a tolerance of ±5 µm, i.e., 45-55 µm, 95-105 µm and 95-105 µm, respectively. However, at positive limits, total net length becomes 265 µm, which may not be acceptable. In such a scenario, a constraint for the total net length can also be generated, which is equal to the total net length as defined by the simulation parameter, with a global net tolerance as defined by the user.

Figure 7:
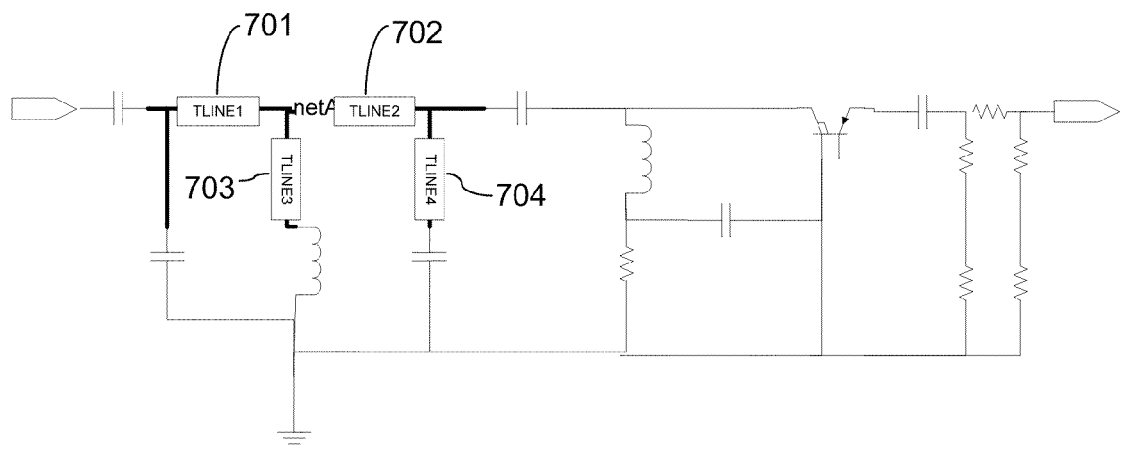
FIG. 7 is an illustrative example of a schematic including virtual T-points, according to some embodiments of the invention.

Embodiments of the present invention can analyze the circuit and generate a set of RF-specific constraints for RF routing. For example, at 606, virtual T-points can be automatically inserted in the layout topology if the logic design contains connections between three or more physical pins. Virtual T-points are added only if the topology requires it. For example, a star configuration will require them, whereas a daisy-chain configuration will not. As shown in FIG. 7, T-points can be generated automatically for connections between component 702 and component 704 and between component 701, component 702 and component 703.

At 608, automatic design rule checks (DRCs) can be generated for topology violations in the layout. In addition, specialized DRCs can be included to determine whether the topology has been followed correctly. If the topology has not been followed correctly, DRC markers with appropriate details can be placed at proper locations. These additional DRCs can easily be integrated with existing DRC engines of layout tools. In addition to the other constraint violations as supported today, the following design rules can be checked by this engine: topology conformance, conformance to a number of allowed discontinuities (e.g., bends, vias, cross, T's) in the route (if specified by the logic designer), and conformance to electrical constraints like impedance matching to specific portions of the route (if specified by the logic designer).

Figure 8:
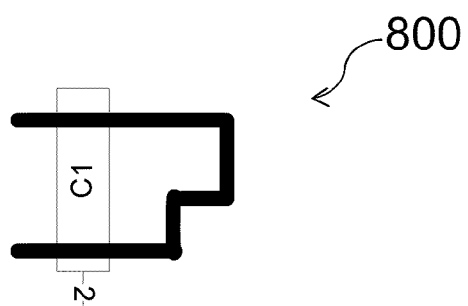
FIG. 8 is an illustrative example of a topology for an RF net.

At 610, DRCs of "forbidden" topologies for layout of a transmission line can be specified. Embodiments of the present invention provide a check on net routing and mark an error if a particular type of routing is done. For example, on a particular RF net, the topology 800 shown in FIG. 8 may be forbidden, resulting in a DRC marker at it's location.

In one embodiment, the present invention allows the logic designer to draw the schematic in such a manner that it intuitively represents the routing topology expected in the layout. The layout designer gets the global routing instructions from the schematic, while maintaining flexibility in performing detailed routing. Thus, some embodiments of the invention allow the logic designer to reuse a simulated RF net topology for layout designs.

Figure 10A:
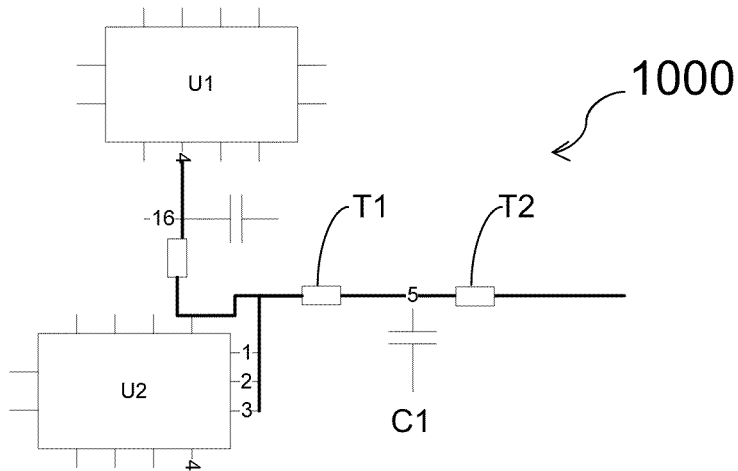
FIG. 10A is an illustrative example of a schematic including a group of pins on one side of a transmission line component and a single pin on the other side of the transmission line component.
Figure 10B:
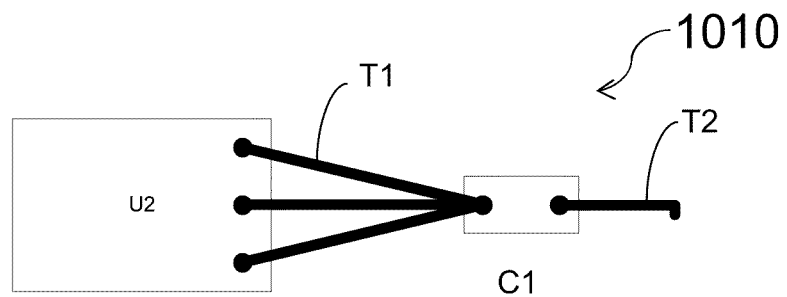
FIG. 10B is an illustrative example of a layout corresponding to the schematic in FIG. 10A, according to some embodiments of the invention.

In some embodiments, the present invention provides for specifying a constraint, such as transmission line component length, between a plurality of pins on one side and a plurality of pins on the other side. For example, for simulation, rather than having to specify a Microstrip length between all pin pairs, a user can specify the Microstrip length between a group of n pins on one side, and a group of m pins on the other side. Such a constraint can be transferred to the layout as a set of n×m combinations. For example, as shown in FIG. 10A, constraints can be defined from a group of pins (i.e., pin 1 through pin 3) in a schematic 1000 to a single pin (i.e., pin 5). The layout 1010 in FIG. 10B corresponding to the schematic 1000 in FIG. 10A depicts that the same constraint needs to be transferred between all pin pairs. The length constraint can be translated from the user-specified simulation parameter for the same.

According to some embodiments of the present inventions, the logic designer has the flexibility of mixing the fixed transmission line components (which are transferred as shape-based components) with transparent transmission elements (which are transferred as routing and topology constraints). Thus, embodiments of the present invention can allow the addition of mandatory and optional transmission line components. Optional components can be added as a routing guide to the layout designer, and may or may not be used during routing. They do not cause DRC violations.

Some embodiments of the present invention allow the user to keep the logical and physical constraints always synchronized. Additionally, an automated way to check the physical layout based on user-specifications in the schematic can be provided. This embodiment can be done using DRC checks and the violations are highlighted using DRC markers in the layout.

According to some embodiments, the present invention has the capability to manage Engineering Change Orders (ECO's) for the routing topology changes. If the user makes a topology change in the schematic, the layout can be automatically informed of the change at the time of the next schematic to layout sync-up. In some embodiments, the schematic is always the master for topology specification, so if the layout designer routes the net using a different topology, DRC's are generated, and the changes are not transferred to the schematic.

Embodiments of the present invention can allow the user to specify the number of discontinuities (i.e., bends) that a particular net route may be allowed to have. For example, the schematic user can specify that no bends are allowed on critical net, or can specify a maximum of two bends. This user specification can be captured on a schematic directly or through a rules file.

Some embodiments of the present invention can be applied to 2-D as well as 3-D topologies. A topology including transmission line components as well as vias can be translated appropriately to the layout. For example, the designer can insert a via between two transmission line segments for a net which needs to be routed on two layers.

According to some embodiments, the present invention can allow dynamic generation of a new component in logic design which is used to back-annotate detailed routing effects under it. For example, in FIG. 7, the component 701 can be inserted automatically by the designer, and marked as a back-annotation component. Post-layout and routing, the designer can import back the actual routing topology as a lower-level schematic block under the symbol for component 701. This enables the designer to perform another level of simulation with results closer to the final routing behavior.

Figure 11:
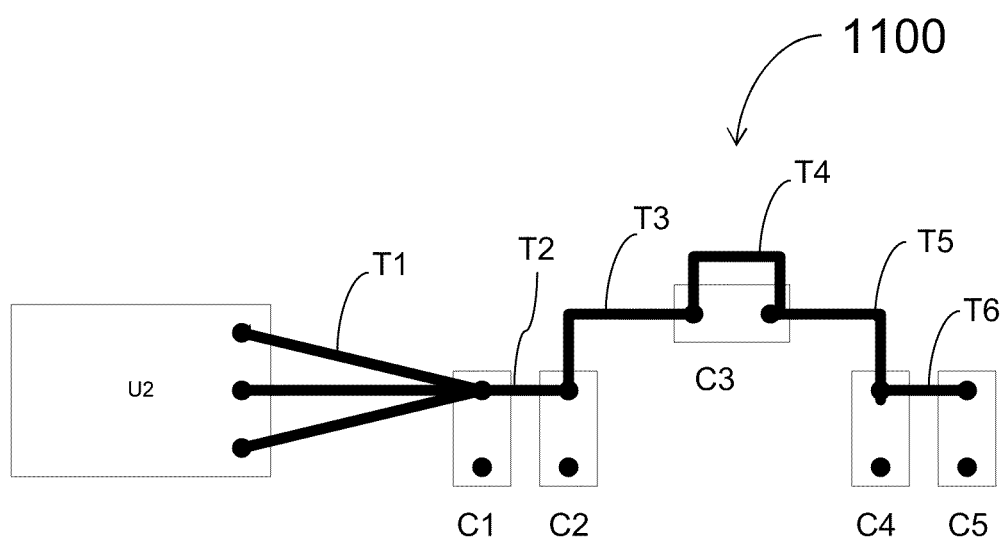
FIG. 11 is an illustrative example of a layout corresponding to a portion of the schematic in FIG. 5, according to some embodiments of the invention.

Consider a design scenario in which the design intent is to route the trace shown in the FIG. 5 schematic 500 with a thick wire. The key requirement here is to place all capacitors C1 through C9 in exactly the same order on a layout as they appear on the schematic 500. A portion of such a layout is shown in FIG. 11 as layout 1100. In the conventional schematic to layout flow, layout designers do not get any details about the order of component placement. They need to manually refer the schematic to find out the order in which to place the capacitors C1 through C9. With the present invention, this information is passed automatically to layout. Layout designers see ratsnest lines in the layout as per the routing topology defined in schematic. It should be well understood by one of ordinary skill in the art that a ratsnest line in a design layout is a line that shows a logical connection between two pins, connect lines, or vias. Elements connected by the same ratsnest line are part of the same net. The ratsnest shows the circuit logic, and the order in which pins are to be connected.

Also, for each portion of the route, length and width constraints can be generated based on the property values on the corresponding transmission line components in the schematic. For example, a length and width constraint can be generated based on simulation model parameters used on transmission line component T2 inserted between points 5 and 6 in FIG. 5. This method will ensure that actual physical implementation is in-sync with the schematic and the layout designer gets these additional routing details along with connectivity information. This method can eliminate the need to manually refer the schematic for routing topology.

Embodiments of the present invention can provide a visual indication to the layout designer during interactive routing for completion of route as per defined topology. Once layout is completed, a user can run the DRC command in layout to check if completed routing adheres to the constraint and topology as defined in schematic.

System Architecture Overview

Figure 12:
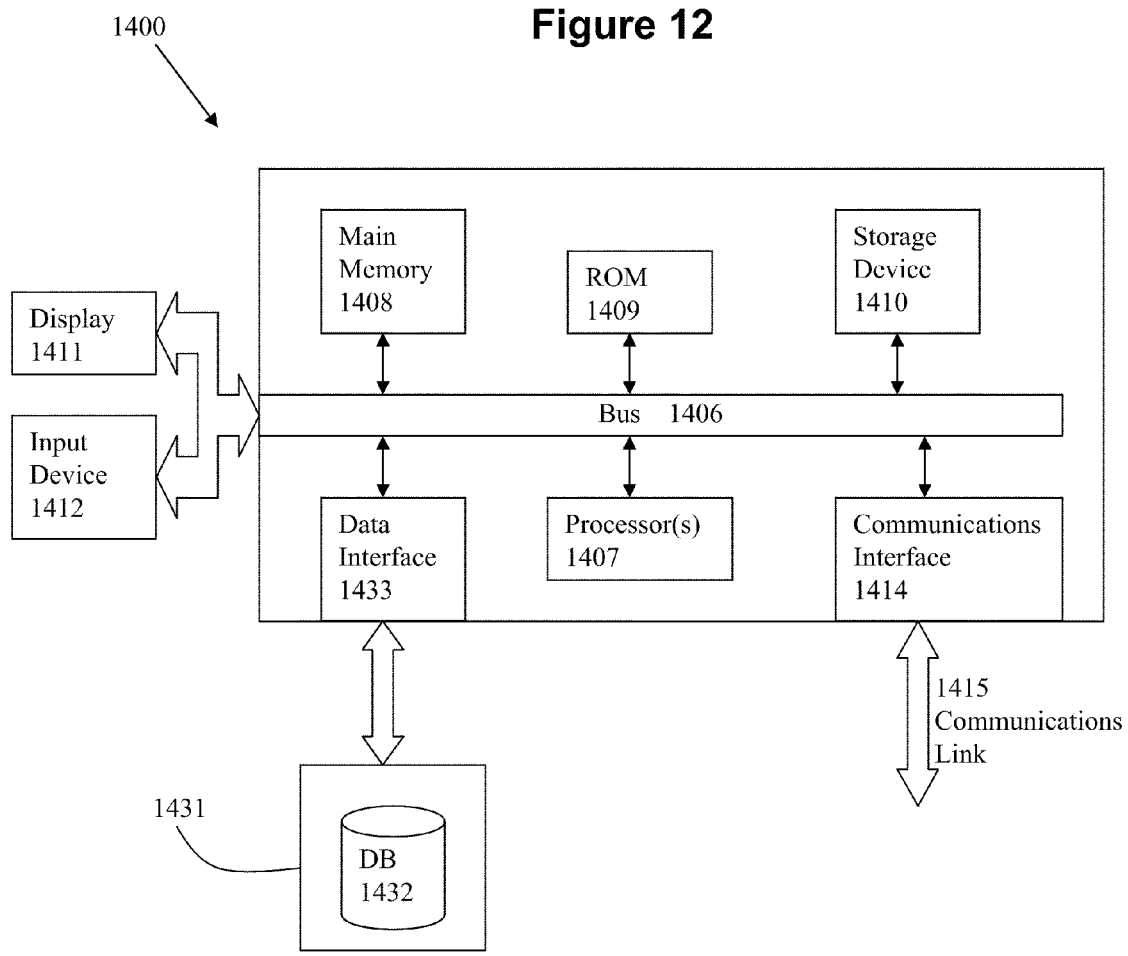
FIG. 12 depicts a computerized system on which a method for generating and transferring topology and constraint information can be implemented.

FIG. 12 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the ordering of many of the described process actions may be changed without affecting the scope or operation of the invention. The specification and drawings are, accordingly, to be regarded in an illustrative rather than restrictive sense.

What is claimed is:

1. A computer implemented method for creating a layout of an electrical design, comprising:
   receiving design information for a schematic of the electrical design for simulation;
   generating one or more routing components, wherein the routing components define physical routing topology and physical routing constraints for the schematic, and wherein the physical routing topology and physical routing constraints are based at least in part upon an order of pin connections in the schematic;
   generating, using a processor, layout routing topology information and layout routing constraint information from the physical routing topology and physical routing constraints defined by the routing components, wherein the act of generating comprises generating layout routing constraints to be used in implementing a physical layout in conformance with the constraints;
   generating the physical layout using the layout routing topology information and layout routing constraint information, such that the layout routing topology information and layout routing constraint information ensure that the routing topology of the physical layout is visually in-sync with the order of pin connections of the schematic; and
   displaying the layout routing topology information and layout routing constraint information on a display device or storing the layout routing topology information and layout routing constraint information in a configured data structure on a non-transitory computer readable medium.

2. The method of claim 1, wherein generating the layout routing topology information and the layout routing constraint information comprises:
   determining whether a net is connected to two or more components; and
   inserting a T-point if the net is connected to two or more components.

3. The method of claim 1, wherein generating the layout routing topology information and the layout routing constraint information comprises:
identifying all transmission line components in the schematic;
choosing one of the transmission line components, wherein the chosen transmission line component is connected to two or more pins;
shorting one or more nets connected to the pins;
choosing a net segment connected to the chosen transmission line component;
determining if the net segment is connected to another one of the transmission line components;
determining if there are other net segments connected to the chosen transmission line component;
adding topology to a master net;
adding constraints for pin pairs and T-points that are part of the master net;
adding a pin map property on the master net; and
determining whether there are more transmission line components to be processed.

4. The method of claim 3, further comprising:
creating a T-point on the master net; and
adding tee-to-pin information on the master net.

5. The method of claim 3, further comprising adding pin pair information on the master net.

6. The method of claim 1, further comprising allowing a user to insert transmission line components between pin pairs in the schematic.

7. The method of claim 6, further comprising receiving width and length parameters associated with each of the transmission line components.

8. The method of claim 1, wherein the physical routing topology and physical routing constraints comprises a range of lengths.

9. The method of claim 1, wherein the physical routing topology and physical routing constraints comprises a transmission line component length between a plurality of pins on one side of the transmission line component and one or more pins on the other side of the transmission line component.

10. The method of claim 1, wherein the physical routing topology and physical routing constraints comprises a length and a tolerance value associated with the length.

11. The method of claim 1, wherein the physical routing topology and physical routing constraints comprises a total net length constraint.

12. The method of claim 1, further comprising receiving information regarding forbidden topologies for a transmission line component.

13. The method of claim 1, wherein generating the layout routing topology information and the layout routing constraint information comprises generating layout routing that follows topology defined in the schematic.

14. The method of claim 1, wherein the physical routing topology and physical routing constraints for the schematic comprises mandatory transmission line components and optional transmission line components.

15. The method of claim 1 further comprising specifying design rule checks of forbidden topologies of a transmission line.

16. A computer program product that includes a non-transitory computer readable medium, the non-transitory computer readable medium comprising a plurality of computer instructions which, when executed by a processor, cause the processor to execute a process for creating a physical layout of an electrical design, the process comprising:
receiving design information for a schematic of the electrical design for simulation;
generating one or more routing components, wherein the routing components define physical routing topology and physical routing constraints for the schematic, and wherein the physical routing topology and physical routing constraints are based at least in part upon an order of pin connections in the schematic;
generating, using a processor, layout routing topology information and layout routing constraint information from the physical routing topology and physical routing constraints defined by the routing components, wherein the act of generating comprises generating layout routing constraints to be used in implementing a physical layout in conformance with the constraints;
generating the physical layout using the layout routing topology information and layout routing constraint information, such that the layout routing topology information and layout routing constraint information ensure that the routing topology of the physical layout is visually in-sync with the order of pin connections of the schematic; and
displaying the layout routing topology information and layout routing constraint information on a display device or storing the layout routing topology information and layout routing constraint information in a configured data structure.

17. The computer program product of claim 16 further comprising specifying design rule checks of forbidden topologies of a transmission line.

18. The computer program product of claim 16, wherein generating the layout routing topology information and the layout routing constraint information comprises:
determining whether a net is connected to two or more components; and
inserting a T-point if the net is connected to two or more components.

19. A system for creating a physical layout of an electrical design, comprising:
a non-transitory computer readable storage medium to store layout routing topology information and layout routing constraint information;
an input device to receive design information for a schematic of the electrical design for simulation, and to generate one or more routing components, wherein the routing components define physical routing topology and physical routing constraints for the schematic for simulation, and wherein the physical routing topology and physical routing constraints are based at least in part upon an order of pin connections in the schematic; and
a processor to execute a computer program code, wherein the computer program is to generate layout routing topology information and layout routing constraint information from the physical routing topology and physical routing constraints defined by the routing components, wherein the act of generating comprises generating layout routing constraints to be used in implementing a physical layout in conformance with the constraints, and to generate the physical layout using the layout routing topology information and layout routing constraint information, such that the layout routing topology information and layout routing constraint information ensure that the routing topology of the physical layout is visually in-sync with the order of pin connections of the schematic.

20. The system of claim 19, further comprising a display device for displaying the layout routing topology information and the layout routing constraint information.

21. The system of claim 19, wherein generating the layout routing topology information and the layout routing constraint information comprises:
- determining whether a net is connected to two or more components; and
- inserting a T-point if the net is connected to two or more components.

22. The system of claim 19 further comprising specifying design rule checks of forbidden topologies of a transmission line.

* * * * *